United States Patent
Chung et al.

(10) Patent No.: US 8,161,349 B2
(45) Date of Patent: Apr. 17, 2012

(54) DATA PARALLELIZING RECEIVER

(75) Inventors: Hoe-Ju Chung, Yongin-si (KR); Joo-Sun Choi, Yongin-si (KR); Ken S. Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 930 days.

(21) Appl. No.: 12/183,552

(22) Filed: Jul. 31, 2008

(65) Prior Publication Data

US 2009/0037800 A1 Feb. 5, 2009

(30) Foreign Application Priority Data

Aug. 1, 2007 (KR) .................. 10-2007-0077477

(51) Int. Cl.
*H03M 13/00* (2006.01)

(52) U.S. Cl. .................. 714/757; 714/758

(58) Field of Classification Search .................. 714/757, 714/758, 807
See application file for complete search history.

(56) References Cited

U.S. PATENT DOCUMENTS

| | | | | |
|---|---|---|---|---|
| 4,105,999 A * | 8/1978 | Nakamura | .................. | 714/757 |
| 4,454,600 A * | 6/1984 | LeGresley | .................. | 714/757 |
| 5,671,238 A * | 9/1997 | Chen et al. | .................. | 714/757 |
| 5,778,013 A * | 7/1998 | Jedwab | .................. | 714/807 |
| 6,029,186 A | 2/2000 | DesJardins et al. | | |
| 6,128,766 A | 10/2000 | Fahmi et al. | | |
| 6,560,742 B1 * | 5/2003 | Dubey et al. | .................. | 714/757 |
| 6,560,746 B1 * | 5/2003 | Morsberger | .................. | 714/781 |
| 6,701,478 B1 * | 3/2004 | Yang et al. | .................. | 714/757 |
| 6,725,415 B2 | 4/2004 | Ishiwaki | | |
| 6,732,317 B1 * | 5/2004 | Lo | .................. | 714/757 |
| 6,810,501 B1 * | 10/2004 | Ferguson et al. | .................. | 714/781 |
| 6,938,197 B2 * | 8/2005 | Doubler et al. | .................. | 714/757 |
| 6,961,893 B1 * | 11/2005 | Mukund et al. | .................. | 714/781 |
| 7,181,671 B2 * | 2/2007 | Tsai et al. | .................. | 714/757 |
| 7,243,289 B1 * | 7/2007 | Madhusudhana et al. | .... | 714/758 |
| 7,428,693 B2 * | 9/2008 | Obuchi et al. | .................. | 714/804 |
| 2004/0158793 A1 * | 8/2004 | Blightman et al. | .......... | 714/758 |

FOREIGN PATENT DOCUMENTS

| | | |
|---|---|---|
| JP | 2000-114987 | 4/2000 |
| KR | 100169362 B1 | 10/1998 |
| KR | 1020040043582 A | 5/2004 |

* cited by examiner

*Primary Examiner* — Yolanda L Wilson
(74) *Attorney, Agent, or Firm* — Volentine & Whitt, PLLC

(57) ABSTRACT

Provided is a data parallelizing receiver including an input signal receiver for externally receiving serial data as packets, sampling the serial data, aligning the sampled data in an input order, and converting the aligned data into parallel data to output the parallel data, a cyclic redundancy check (CRC) partial calculator for receiving the parallel data, classifying the parallel data into groups according to the input order, and performing a partial CRC calculation on each of the groups to sequentially output a plurality of partial CRC calculation results, and a CRC partial calculation merger for receiving the plurality of partial CRC calculation results and merging the partial CRC calculation results to output CRC calculation data.

12 Claims, 6 Drawing Sheets

DATA PARALLELIZING RECEIVER

CROSS REFERENCE TO RELATED APPLICATION

This application claims the benefit of Korean Patent Application No. 2007-77477, filed Aug. 1, 2007, the subject matter of which is hereby incorporated by reference.

BACKGROUND

1. Field of the Invention

The present invention relates to a data receiver and, more particularly, to a data parallelizing receiver, which reduces a time taken to perform a data error correction process and output a command after the command is input when the number of input bits to be parallelized is increased in a system requiring a high data rate.

2. Description of Related Art

In recent years, in order to increase the transmission rate of signals with an increase in a chip-to-chip operating frequency, a data transmission system has adopted a point-to-point signal transmission method in which whenever data is input or output, the data transmission system forms its own transmission path to prevent other data transmission systems from using the transmission path. Also, in order to reduce the processing speed of internal commands, the data transmission system has employed serialization/parallelization methods.

Furthermore, an operating latency of a chip that outputs a signal in response to a command must be reduced in order to improve the performance of a system. In particular, high-speed data transmission systems are showing a tendency of adopting an error correction process of detecting and examining signal transmission errors when the errors occur during an interface operation.

A typical method of detecting data errors is based on cyclic redundancy check (CRC) calculation. According to the CRC calculation method, a redundancy bit is added to data to be transmitted through a data transmitting terminal to generate a system code, the system code is transmitted, and a CRC calculation is performed through a data receiving terminal in a data packet to detect a data error.

The CRC calculation method is performed using software or hardware. When the CRC calculation is performed using software, many process operations are required, thereby resulting in wasteful use of a microprocessor. For this reason, the CRC calculation using hardware is a trend that has been increasing lately.

The most common CRC calculation method using hardware is to adopt a shift register. Although it is efficient to use the shift register in a system having a low data rate, the use of the shift register has a technical limit for processing data at a high speed of several hundreds of Mbps to several tens of Gbps.

A data transmission system must process clock signals at a speed of several tens of Gbps so that each bit of data may be CRC-processed at a speed of several tens of Gbps as in a conventional method. Accordingly, as a data rate increases, a conventional system requires as an external line driver an expensive high-speed device operating at a speed of several tens of Gbps and processes data in parallel in the previous blocks. However, as the data transmission system processes more data in parallel, designing circuits becomes more difficult.

FIG. 1 is a circuit diagram of a conventional data parallelizing receiver.

Referring to FIG. 1, the conventional data parallelizing receiver includes a clock generator 5, a plurality of input signal receivers 10-1 to 10-6, a command decoder 30, a command queue 40, a multiplexer MUX, a plurality of CRC calculators 50-1 to 50-8, a data error determiner NOR, a delayer 20, and an error command selector 60.

Although the conventional data parallelizing receiver is illustrated as including a plurality of input signal receivers 10-1 to 10-6 and a plurality of CRC calculators 50-1 to 50-8, the data parallelizing receiver may include a single input signal receiver and a single CRC calculator. Therefore, for brevity, only a first input signal receiver 10-1 and a first CRC calculator 50-1 will be chiefly described in detail.

The input signal receiver 10-1 includes a demultiplexer 12-1 and a data parallelizer 14-1. The demultiplexer 12-1 includes a plurality of input buffers B1 to B4, and the data parallelizer 14-1 includes a plurality of flip-flops D1 to D4 and a data framer 16-1. The command decoder 30 includes a command decoding unit 32 and a first flip-flop D6. The CRC calculator 50-1 includes a CRC detector 52-1, which includes a plurality of XOR gates, and a second flip-flop D7-1. The error command selector 60 includes a single AND gate AND and a third flip-flop D9.

For brevity, it is assumed that 6 lanes for data transceiving paths are connected to an external interface, four commands may be fetched at one time, and 9 serial data are externally transmitted as 5 packets a0~a8 to e0~e8.

Functions of the respective blocks of the conventional data parallelizing receiver will now be described with reference to FIG. 1.

The clock generator 5 receives a system clock signal sys_ck for controlling operation of the entire data parallelizing receiver and generates a plurality of sampling clock signals s_ck[3:0] and a framing clock signal f_ck. The sampling clock signals s_ck[3:0] are quartered, delayed for predetermined times, and synchronized in order to sample a plurality of serial data, and the framing clock signal f_ck is divided into ninths and synchronized in order to frame a plurality of sampled parallel data.

The demultiplexer 12-1 of the input signal receiver 10-1 receives 9 serial data as five packets a0~a8 to e0~e8 through 6 lanes, demultiplexes the received data, delays the demultiplexed data by a predetermined time, and outputs four parallel data through each of the 6 lanes.

The data parallelizer 14-1 of the input signal receiver 10-1 receives the 4 parallel data through each of the 6 lanes. The flip-flops D1 to D4 sample data bits of the received parallel data in synchronization with the sampling clock signals s_ck [3:0] and output a parallel receiving data signal para_D[4:1]. The data framer 16-1 aligns the sampled data bits in packet units in synchronization with the framing clock signal f_ck and outputs a framing data signal frame_D[8:0].

In the command decoder 30, the command decoding unit 32 receives aligned data from the data parallelizer 14-1 and decodes the received data to detect the kinds of commands. Thus, the first flip-flop D6 outputs decoded commands in synchronization with the framing clock signal f_ck.

In the CRC calculator 50-1, the CRC detector 52-1 receives the aligned data from the data parallelizer 14-1, adds a redundancy bit to the received data to generate a system code, and transmits the system code. A CRC calculation is performed in packet units through a data receiving terminal to detect a data error so that the validity of an input command packet is inspected. Thereafter, the second flip-flop D7-1 outputs a CRC calculation data signal CRC[7:0] in synchronization with the framing clock signal f_ck.

In the CRC calculation, a logic XOR is performed on data to be transmitted through a data transmitting terminal, according to a predetermined generator polynomial to transform the data, a CRC code corresponding to the transformed data is written, the CRC code is added to the transformed data to generate final data, and the final data is transmitted. The final data is divided through a data receiving terminal to detect whether the received data has an error depending on the presence or absence of the remainder. Since the CRC calculation is known to one of ordinary skill, a further detailed description thereof will be omitted.

The data error determiner NOR receives plural-bit CRC calculation data signals CRC[7:0] from a plurality of CRC calculators 50-1 to 50-8 and performs a logic NOR on the plural-bit CRC calculation data signals CRC[7:0]. Thus, when a data error is detected and even a single-bit data signal is applied at a high level, the data error determiner NOR outputs an error determination signal /ERR at a low level.

As the bit number of the aligned data output by the data parallelizer 14-1 increases, the number of XOR gates required by CRC detectors 52-1 to 52-8 increases, thereby delaying a predetermined time. Since the delayed time is longer than a delay time taken for the command decoding unit 32 to decode a command, the delayer 20 delays the command by a predetermined time so that a sufficient data setup time and a sufficient data hold-time may be ensured after the command is decoded.

The command queue 40 stores commands output by the command decoder 30 according to functions of execution commands, puts the commands on standby for a predetermined time according to a data transmission protocol, and outputs the commands.

The multiplexer MUX receives the decoded commands from the command decoding unit 32 and the command queue 40 and directly outputs the commands decoded by the command decoding unit 32 or outputs the commands, which are put on standby in the command queue 40 for the predetermined time, in response to a selection signal "sel" according to the data transmission protocol.

In the error command selector 60, the AND gate AND receives the commands, which are directly output from the command decoding unit 32 through the multiplexer MUX or put on standby for the predetermined time in the command queue 40, and the error determination signal /ERR output from the data error determiner NOR, and performs a logic AND on the commands and the error determination signal /ERR, and the third flip-flop D3 outputs an AND result in synchronization with the framing clock signal f_ck. Thus, only when the first CRC calculator 50-1 inputs a valid command packet without a data error, does the error command selector 60 selectively output the AND result to a core logic circuit.

FIG. 2 is a circuit diagram of the plurality of CRC calculators 50-1 to 50-8 and the data error determiner NOR of the conventional data parallelizing receiver shown in FIG. 1.

Referring to FIG. 2, the CRC calculators 50-1 to 50-8 and the data error determiner NOR include multistage XOR gates 1X_11 to 8X_L1, a plurality of flip-flops D7-1 to D7-8, and a NOR gate NOR. In FIG. 2, input signals "fxy" applied to input terminals of first-stage XOR gates 1X_11 to 1X_1a denote y-th-bit data signals of 9-bit framing data signals frame_D[8:0] output through x-th lanes of the 6 lanes, respectively.

In the first CRC calculator 50-1, the first-stage XOR gates 1X_11 to 1X_1a of the multistage XOR gates receive combinations f00 to f57 of input signals obtained by a CRC calculation algorithm out of 54-bit framing merge signals f_merge[53:0]) of the 5 respective packets that are output through the 6 lanes, perform a logic XOR on the combinations f00 to f57, and output XOR results. Second-stage XOR gates 1X_21 to 1X_2b receive the output signals of the first-stage XOR gates 1X_11 to 1X_1a and perform a logic XOR on the received signals again. In this process, an L-stage XOR gate 1X_L1 finally outputs a first CRC calculation data signal CRC[0].

In the above-described method, the multistage XOR gates 1X_11 to 8X_L1 receive output signals of front-stage XOR gates, perform a logic XOR on the received signals, and output second to eighth CRC calculation data signals CRC[7:1].

The flip-flops D7-1 to D7-8 receive respective bits of the CRC calculation data signals from the multistage XOR gates 1X_11 to 8X_L1 and output the received bits of the CRC calculation data signals in synchronization with the framing clock signal f_ck.

The NOR gate NOR receives the CRC calculation data signals CRC[7:0], which are synchronized with the framing clock signal f_ck, from the flip-flops D7-1 to D7-8, performs a logic NOR on the received signals, and finally outputs the error determination signal /ERR.

Operation of the CRC calculators 50-1 to 50-8 and the data error determiner included in the conventional data parallelizing receiver will now be described with reference to FIG. 2.

In a conventional CRC detection process, data is transformed according to predetermined rules through a data transmitting terminal, a CRC code corresponding to the transformed data is written and added to the transformed data to generate final data, and the final data is transmitted. Thereafter, the final data is received and checked through a data receiving terminal to detect data errors.

A specific logic multiplication is performed on the data to be transmitted through the data transmitting terminal to transform the data, and the received data is divided through the data receiving terminal to determine whether the data has an error depending on the presence or absence of the remainder.

In this case, a generator polynomial for writing the CRC code is previously determined. The data to be transmitted is multiplied by the generator polynomial through the data transmitting terminal to transform the data, the transformed data is divided by the generator polynomial again through the data transmitting terminal to obtain a quotient and the remainder corresponding to the CRC code, and the CRC code is added to the transformed data to generate final data to be transmitted. The final data is received and divided by the generator polynomial again through the data receiving terminal. Thus, when the remainder is 0, it is determined that no data error has occurred.

CRC calculation methods using hardware may be classified into a serial CRC calculation method and a parallel CRC calculation method. The serial CRC calculation method is performed by shifting data bit by bit using a plurality of shift registers. By comparison, as shown in FIG. 2, in the parallel CRC calculation method, a plurality of XOR gates receive the combinations f00 to f57 of the input signals obtained by a software algorithm for CRC calculation and make CRC calculation of plural-bit data signals at one time.

In FIG. 2, the parallel CRC calculation method, which is faster than the serial CRC calculation method, is performed. According to a generator polynomial ($X^8+X^5+X^3+X^2+X+1$), a first CRC calculation data signal CRC[0] is f00 ^ f10 ^ f30 ^ f41 ... f47 ^ f58, and an eighth CRC calculation data signal CRC[7] is f00 ^ f10 ^ f20 ^ f40 ... f37 ^ f57. Here, a symbol ^ denotes an XOR operator. Since a process of obtaining the CRC calculation data signals CRC[0] and CRC[7] using a software algorithm and calculation values of the remaining CRC calculation data signals CRC[6:2] are known to one of ordinary skill, a further detailed description thereof will be omitted here.

The NOR gate NOR receives the obtained CRC calculation data signals CRC[7:0], performs a logic NOR on the received signals CRC[7:0], and finally outputs the error determination signal /ERR that is CRC[0]# CRC[1]# CRC[2] . . . # CRC[7]. Here, a symbol # denotes a NOR operator.

Accordingly, the conventional CRC calculators 50-1 to 50-8 and the data error determiner NOR receive combinations of input signals, which are obtained by the CRC calculation algorithm out of the 54-bit framing merge signals f_merge [53:0]) of the 5 respective packets that are output through the 6 lanes, in parallel at one time, gradually perform a logic XOR on the received combinations in proportion to the bit number of data, and perform CRC calculations. Thus, when a data error is detected and even a single bit of the 8-bit CRC calculation data signal CRC[7:0] is applied at a high level, the data error determiner NOR outputs the error deter signal /ERR at a low level.

FIG. 3 is a timing diagram illustrating operation of the conventional data parallelizing receiver shown in FIG. 1.

Referring to FIG. 3, the operation of the conventional data parallelizing receiver is related to the input and output of a system clock signal sys_ck, a sampling clock signal s_ck[3:0], a serial input data signal ser_Dx (x is one of 1 to 6), a parallel receiving data signal para_D[4:1], a framing data signal frame_Dx[8:0] (x is one of 1 to 6), a framing clock signal f_ck, a framing merge signal f_merge[53:0], a CRC calculation data signal CRC[7:0], and an error determination signal /ERR.

Similarly, for brevity, it is assumed that 6 lanes for data transceiving paths are connected to an external interface, four commands may be fetched at one time, and each of 9 serial data is externally transmitted as 5 packets a0~a8 to e0~e8. Also, it is assumed that the sampling clock signal s_ck[3:0] is generated by quartering the system clock signal sys_ck and the framing clock signal f_ck is generated by dividing the system clock signal sys_ck into ninths.

The system clock signal sys_ck is toggled at periods of a unit interval (UI).

The system clock signal sys_ck is received and quartered to generate the sampling clock signals s_ck[3:0], each of which is delayed by one UI and toggled at periods of 4 UIs.

9 serial data a0~a8 to e0~e8 of five packets are sequentially received through the external 6 lanes and loaded on the serial input data signal ser_Dx.

The demultiplexer 12-1 sequentially receives 9 serial data a0~a8 to e0~e8 of the 5 packets and demultiplexes each of the received data in a ratio of 1:4. Thereafter, the flip-flops D1 to D4 of the data parallelizer 14-1 sample the demultiplexed data in synchronization with the sampling clock signal s_ck [3:0], fetch the sampled data through 4 data lines at periods of a UI, and load parallel data a0~a3, a4~a7, . . . on the parallel receiving data signal para_D[4:1].

The data framer 16-1 of the data parallelizer 14-1 receives the parallel receiving data signal para_D[4:1], sequentially aligns the received data in 18 data lines in packet units at periods of a UI in synchronization with the framing clock signal f_ck, and loads parallel data a0~a8 to e0~e8 on the framing data signal frame_Dx[8:0].

The system clock signal sys_ck is received and divided into ninths to generate the framing clock signal f_ck, which is toggled at periods of 9 UIs.

The framing data signals frame_Dx[8:0], which are aligned in packet units, are received through the 6 respective lanes and merged in synchronization with the framing clock signal f_ck so that the framing merge signals f_merge[53:0] are sequentially loaded on a 54-bit data bus.

The CRC calculator 50-1 receives the framing merge signal f_merge[53:0] and makes a predetermined CRC calculation to detect a data error, so that the CRC calculation data signals CRC[7:0] are sequentially loaded on an 8-bit data bus.

The error determination signal /ERR is maintained at a high level until the data error determiner NOR receives the CRC calculation data signals CRC[7:0] and performs a logic NOR on the CRC calculation data signals CRC[7:0]. Thus, when a data error is detected and even a single-bit data signal of the 8-bit CRC calculation data signal CRC[7:0] is applied at a high level, the error determination signal /ERR is disabled to a low level.

Operation of the conventional data parallelizing receiver will now be described with reference to FIGS. 1 through 3.

Similarly, for brevity, it is assumed that 6 lanes for data transceiving paths are connected to an external interface, four commands may be fetched at one time, and each of 9 serial data is externally transmitted as 5 packets a0~a8 to e0~e8. Also, it is assumed that the sampling clock signal s_ck[3:0] is generated by quartering the system clock signal sys_ck and the framing clock signal f_ck is generated by dividing the system clock signal sys_ck into ninths.

When the conventional data parallelizing receiver externally and sequentially receives 9 serial data a0~a8 to e0~e8 as 5 packets through 6 lanes, the demultiplexer 12-1 receives the 9 serial data a0~a8 to e0~e8, demultiplexes each of the 9 serial data a0~a8 to e0~e8 in a ratio of 1:4, delays the demultiplexed data by a predetermined time, and outputs 4 parallel data through each of the lanes.

The clock generator 5 receives the system clock signal sys_ck, which is toggled at periods of a UI to control the operation of the data parallelizing receiver, and generates a plurality of sampling clock signals s_ck[3:0] and a framing clock signal f_ck. The system clock signal sys_ck is quartered to generate the sampling clock signals s_ck[3:0], which are delayed by 1 UI at periods of 4 UIs and synchronized in order to sample a plurality of serial data a0~a8 to e0~e8. Also, the system clock signal sys_ck is divided into ninths to generate the framing clock signals f_ck, which are synchronized at periods of 9 UIs in order to frame a plurality of sampled parallel data.

The 4 flip-flops D1 to D4 of the data parallelizer 14-1 receive 4 parallel data through each of the lanes, sample bits of the parallel data in synchronization with the sampling clock signal s_ck[3:0], sequentially fetch the sampled data through 4 data lines at periods of a UI, and output pipeline-type parallel receiving data signals para_D[4:1].

Also, the data framer 16-1 of the data parallelizer 14-1 receives the 4 fetched parallel receiving data signals para_D [4:1], sequentially aligns the received data signals in 18 data lines in packet units at periods of a UI, and outputs 9 parallel data through each of the lanes as pipeline-type framing data signals frame_Dx[8:0].

The framing data signals frame_Dx[8:0], which are transmitted through each of the 6 lanes, are merged in synchronization with the framing clock signal f_ck so that framing merge signals f_merge[53:0] are sequentially loaded on the 54-bit data bus.

Each of the respective CRC calculators 50-1 to 50-8 receives the framing merge signals f_merge[53:0] through a plurality of XOR gates of the corresponding one of the CRC detectors 52-1 to 52-8. Thereafter, a logic XOR is performed on the framing merge signals f_merge[53:0] according to a predetermined generator polynomial through the data transmitting terminal to transform data, a CRC code corresponding to the transformed data is written and added to the transformed data to generate final data, and the final data is transmitted. The final data is divided through the data receiving terminal to detect whether the received data has a data error depending on the presence or absence of the remainder. After that, the second flip-flops D7-1 to D7-8 sequentially output the CRC calculation data signals CRC[7:0] to an 8-bit data bus in synchronization with the framing clock signal f_ck.

The data error determiner NOR receives plural-bit CRC calculation data signals CRC[7:0] from the CRC calculators 50-1 to 50-8 and performs a logic NOR on the CRC calculation data signals CRC[7:0]. Thus, when a data error is detected and even a single bit of the CRC calculation data signal CRC[7:0] is applied at a high level, the data error determiner NOR outputs the error determination signal /ERR at a low level.

Meanwhile, the command decoding unit 32 receives a 54-bit framing merge signal f_merge[53:0], decodes the framing merge signal f_merge[53:0] to detect the kinds of input commands, and outputs decoded commands. The first flip-flop D6 receives the decoded commands and outputs the decoded commands in synchronization with the framing clock signal f_ck.

The command queue 40 receives the decoded commands, which are output in synchronization with the framing clock f_ck, temporarily stores the commands according to functions of execution commands, puts the commands on standby for a predetermined time according to a data transmission protocol, and outputs the commands.

The multiplexer MUX receives the decoded commands from the first flip-flop D6 and the command queue 40 and directly outputs the commands decoded by the command decoding unit 32 or outputs the commands, which are put on standby in the command queue 40 for the predetermined time, in response to a selection signal "sel" according to the data transmission protocol. The selection signal "sel" is generated by performing a logic combination of a plurality of control bit signals using the command decoding unit 32.

That is, when the selection signal "sel" is at a low level, the multiplexer MUX directly outputs the commands decoded by the command decoding unit 32, and when the selection signal "sel" is at a high level, the multiplexer MUX outputs the commands, which are put on standby according to the data transmission protocol.

The error command selector 60 receives selected commands from the multiplexer MUX. Thus, only when the data error determiner NOR inputs a valid command packet without a data error, does the third flip-flop D9 selectively output a final output signal to the core logic circuit of the data parallelizing receiver in synchronization with the framing clock f_ck.

Specifically, the AND gate AND directly receives the commands from the command decoding unit 32 through the multiplexer MUX, or receives the commands put on standby for the predetermined time in the command queue 40 and further receives the error determination signal /ERR from the data error determiner NOR. Thus, only when the data error determiner NOR detects no data error and the error determination signal /ERR is applied at a high level, does the AND gate AND perform a logic AND on the commands and the error determination signal /ERR and output an AND result to the third flip-flop D9. Thus, the third flip-flop D3 finally outputs the AND result in synchronization with the framing clock signal f_ck to the core logic circuit of the data parallelizing receiver.

However, as the bit numbers of the framing merge signals f_merge[53:0] applied to a plurality of XOR gates of the CRC detectors 52-1 to 52-8 of the CRC calculators 50-1 to 50-8 increase, the number of XOR gates required by the CRC detectors 52-1 to 52-8 increases, thereby delaying a predetermined time, which is longer than a delay time taken for the command decoding unit 32 to decode a command.

Therefore, it is necessary to ensure a sufficient data setup time and a sufficient data hold-time after the command is decoded. Accordingly, the data parallelizing receiver must further include the delayer 20, which delays the command by a predetermined time directly before the command is decoded. However, the use of the delayer 20 leads to an increase in a command input latency, which becomes more problematic as the number of input bits to be parallelized in a high-speed data transmission system increases.

SUMMARY OF THE INVENTION

An embodiment of the invention provides a data parallelizing receiver, which receives a plurality of command packets, separately aligns a previously input bitstream and a subsequently input bitstream in synchronization with at least two clock signals having different phases in the input order of commands, performs partial cyclic redundancy check (CRC) calculations on the aligned bitstreams, and merges the partial CRC calculation results, thereby time-adaptively detecting a data error.

In one aspect, the present invention is directed to a data parallelizing receiver including: an input signal receiver for externally receiving serial data as packets, sampling the serial data, aligning the sampled data in an input order, and converting the aligned data into parallel data to output the parallel data; a CRC partial calculator for receiving the parallel data, classifying the parallel data into groups according to the input order, and performing a partial CRC calculation on each of the groups to sequentially output a plurality of partial CRC calculation results; and a CRC partial calculation merger for receiving the plurality of partial CRC calculation results and merging the partial CRC calculation results to output CRC calculation data.

The data parallelizing receiver may further include: a clock generator for receiving a system clock signal of the data parallelizing receiver to generate a plurality of first clock signals, which are divided, delayed by predetermined time intervals, and synchronized to sample the serial data, a second clock signal, which is divided and synchronized to frame the sampled data, and a third clock signal, which is synchronized by leaving a phase of the third clock signal behind a phase of the second clock signal by a predetermined period; a command decoder for receiving a first bitstream of a parallel data merge signal obtained by merging a previously input first bitstream of each of the groups to generate a third bitstream of the parallel data merge signal in synchronization with the third clock signal and for receiving a second bitstream of a parallel data merge signal obtained by merging a subsequently input second bitstream of each of the groups, merging the received second bitstream, and decoding the merged second bitstream to output decoded commands; an output command selector for receiving the decoded commands, temporarily storing the decoded commands according to functions of execution commands, and putting the decoded commands on standby for a predetermined time to selectively output the decoded commands in response to a selection signal that is received along with the decoded commands; a data error determiner for receiving the CRC calculation data, performing a logic NOR on the CRC calculation data, and determining whether there is a data error to output an error determination signal; and an error command selector for receiving the decoded command and the error determination signal and performing a logic AND on the decoded command and the error determination signal to selectively output the decoded command only when the data error is not detected.

The input signal receiver of the data parallelizing receiver may include: a demultiplexer for externally sequentially receiving the serial data as a plurality of packets and demultiplexing the serial data to output the parallel data; a plurality of flip-flops for receiving the parallel data, sampling bits of the parallel data in synchronization with the first clock signal, and sequentially fetching the sampled data through a plurality of data lines at periods of a unit interval (UI) to output a pipeline-type parallel receiving data signal; and a data framer for receiving the parallel receiving data signal, separating the previously input first bitstream from the subsequently input second bitstream, and aligning the sampled data bits in synchronization with the second clock signal or the third clock signal to output first and second parallel data signals.

The input signal receiver of the data parallelizing receiver may merge the first parallel data signals, which are respectively output through a plurality of lanes, to sequentially output the first bitstream of the parallel data merge signal, and merge the second parallel data signals, which are respectively output through the lanes to sequentially output the second bitstream of the parallel data merge signal.

The command decoder of the data parallelizing receiver may include: a first flip-flop for receiving the first bitstream of the parallel data merge signal to output the third bitstream of the parallel data merge signal in synchronization with the third clock signal; a command decoding unit for receiving and merging the third bitstream of the parallel data merge signal and the second bitstream of the parallel data merge signal and decoding the merged bitstream to output the decoded command; and a second flip-flop for receiving the decoded command to output the decoded command in synchronization with the third clock signal.

The output command selector of the data parallelizing receiver may include: a command queue for receiving the decoded commands, temporarily storing the decoded commands according to functions of execution commands, and putting the decoded commands on standby for a predetermined time according to a data transmission protocol to output the decoded commands; and a multiplexer for receiving the decoded commands from the command decoder and the command queue to selectively output the commands in response to the selection signal.

The multiplexer of the output command selector may directly output the commands decoded by the command decoding unit when the selection signal is at a low level, and output the commands, which are put on standby in the command queue for the predetermined time when the selection signal is at a high level.

The CRC partial calculator of the data parallelizing receiver may include: a first CRC partial calculator for receiving the first bitstream of the parallel data merge signal and partially performing CRC calculation to previously output a first partial CRC calculation result in synchronization with the third clock signal; and a second CRC partial calculator for receiving the second bitstream of the parallel data merge signal and partially performing CRC calculation to subsequently output a second partial CRC calculation result.

The first CRC partial calculator of the CRC partial calculator may include: a first CRC detector for receiving the first bitstream of the parallel data merge signal and partially performing CRC calculation to output the first partial CRC calculation result; and a third flip-flop for receiving the first partial CRC calculation result to output a first CRC partial calculation data signal in synchronization with the third clock signal.

The second CRC partial calculator of the CRC partial calculator may include a second CRC detector for receiving the second bitstream of the parallel data merge signal and partially performing CRC calculation to output the second CRC partial calculation data signal.

Each of the first and second CRC detectors may include a plurality of XOR gates, which receive the parallel data merge signals and generate remainders obtained by dividing the parallel data merge signals by data corresponding to a generator polynomial as the plurality of CRC partial calculation data signals.

The CRC partial calculation merger of the data parallelizing receiver may include: an XOR gate for receiving the first and second CRC partial calculation data signals to perform a logic XOR on the first and second CRC partial calculation data signals; and a fourth flip-flop for receiving an XOR result to output the CRC calculation data in synchronization with the third clock signal.

The error command selector of the data parallelizing receiver may include: an AND gate for receiving the decoded command or the command put on standby for the predetermined time via a first input terminal, receiving the XOR result via a second input terminal, and performing a logic AND on the received command and the XOR result to output an AND result; and a fifth flip-flop for receiving the AND result to output the decoded command or the command put on standby for the predetermined time in synchronization with the third clock signal.

The error command selector may selectively output the decoded command or the command put on standby for the predetermined time only when no data error is detected by the data error determiner and the error determination is output at a high level.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DESCRIPTION OF EMBODIMENTS

A data parallelizing receiver according to the present invention will be described more fully hereinafter with reference to the accompanying drawings, in which exemplary embodiments of the invention are shown.

Like a conventional data parallelizing receiver, for brevity, it is assumed that 6 lanes for data transceiving paths are connected to an external interface, four commands may be fetched at one time, and each of 9 serial data is externally transmitted as 5 packets a0~a8 to e0~e8. Also, it is assumed that the sampling clock signal s_ck[3:0] is generated by quartering the system clock signal sys_ck and the framing clock signal f_ck is generated by dividing the system clock signal sys_ck into ninths.

Also, it is assumed that, among 9-bit framing data signals that are output by a plurality of input signal receivers 100-1 to 100-6 through the 6 lanes, a first bitstream f1_Dx[4:0] that is previously output is a 5-bit bitstream, and a second bitstream f2_Dx[8:5] that is subsequently output is a 4-bit bitstream.

Figure 4:
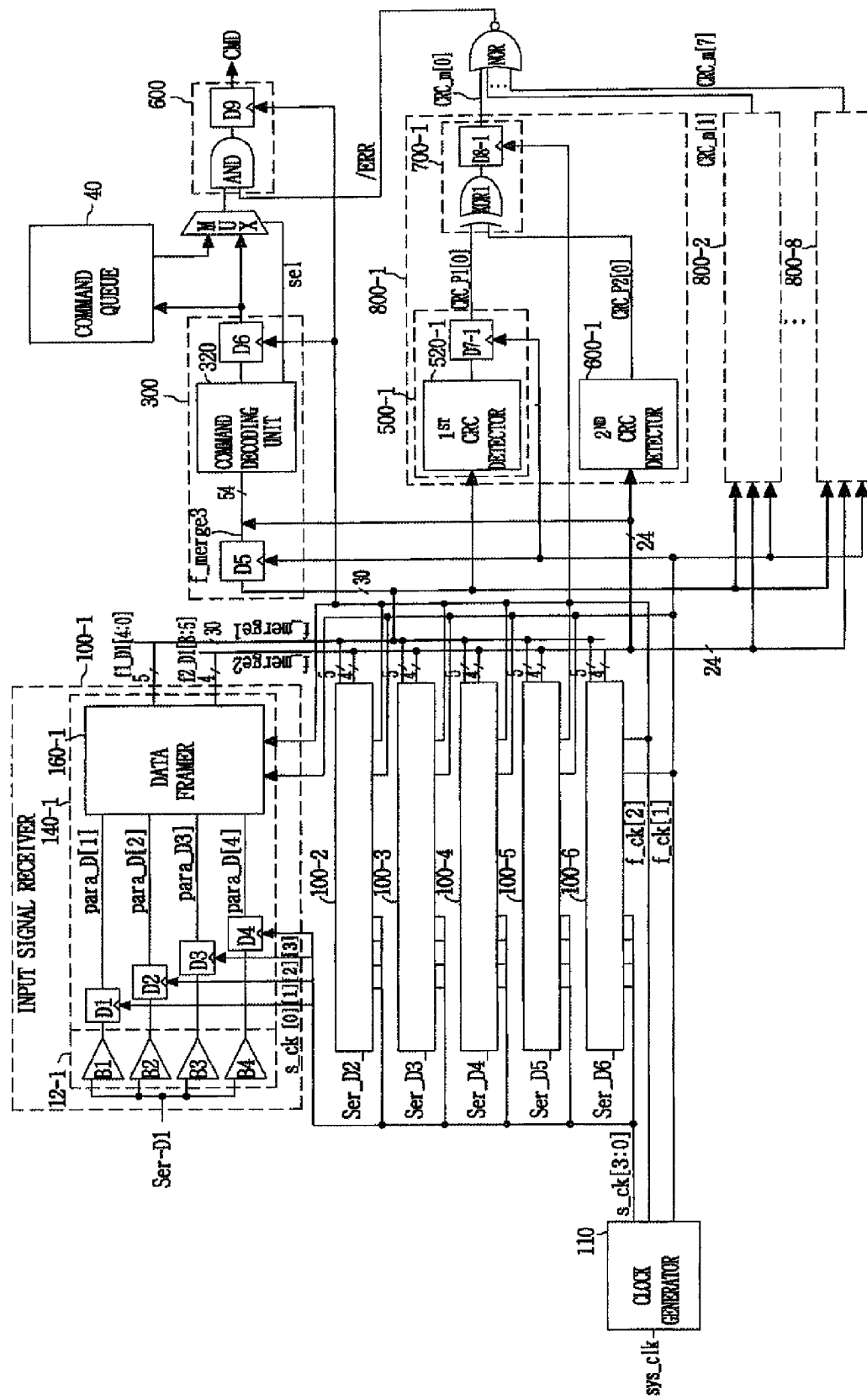
FIG. 4 is a circuit diagram of a data parallelizing receiver according to an exemplary embodiment of the present invention.

FIG. 4 is a circuit diagram of a data parallelizing receiver according to an exemplary embodiment of the present invention.

Referring to FIG. 4, the data parallelizing receiver includes a clock generator 110, a plurality of input signal receivers 100-1 to 100-6, a command decoder 300, a plurality of cyclic redundancy check (CRC) calculators 800-1 to 800-8, a data error determiner NOR, and an error command selector 600. The CRC calculators 800-1 to 800-8 include first CRC partial calculators 500-1 to 500-8, second CRC partial calculators 600-1 to 600-8, and CRC partial calculation mergers 700-1 to 700-8, respectively.

Although the data parallelizing receiver is illustrated as including a plurality of input signal receivers 100-1 to 100-6 and a plurality of CRC calculators 800-1 to 800-8, the data parallelizing receiver may include a single input signal receiver and a single CRC calculator. Therefore, for brevity, only a first input signal receiver 100-1 and a first CRC calculator 800-1 will be chiefly described in detail.

Figure 1:
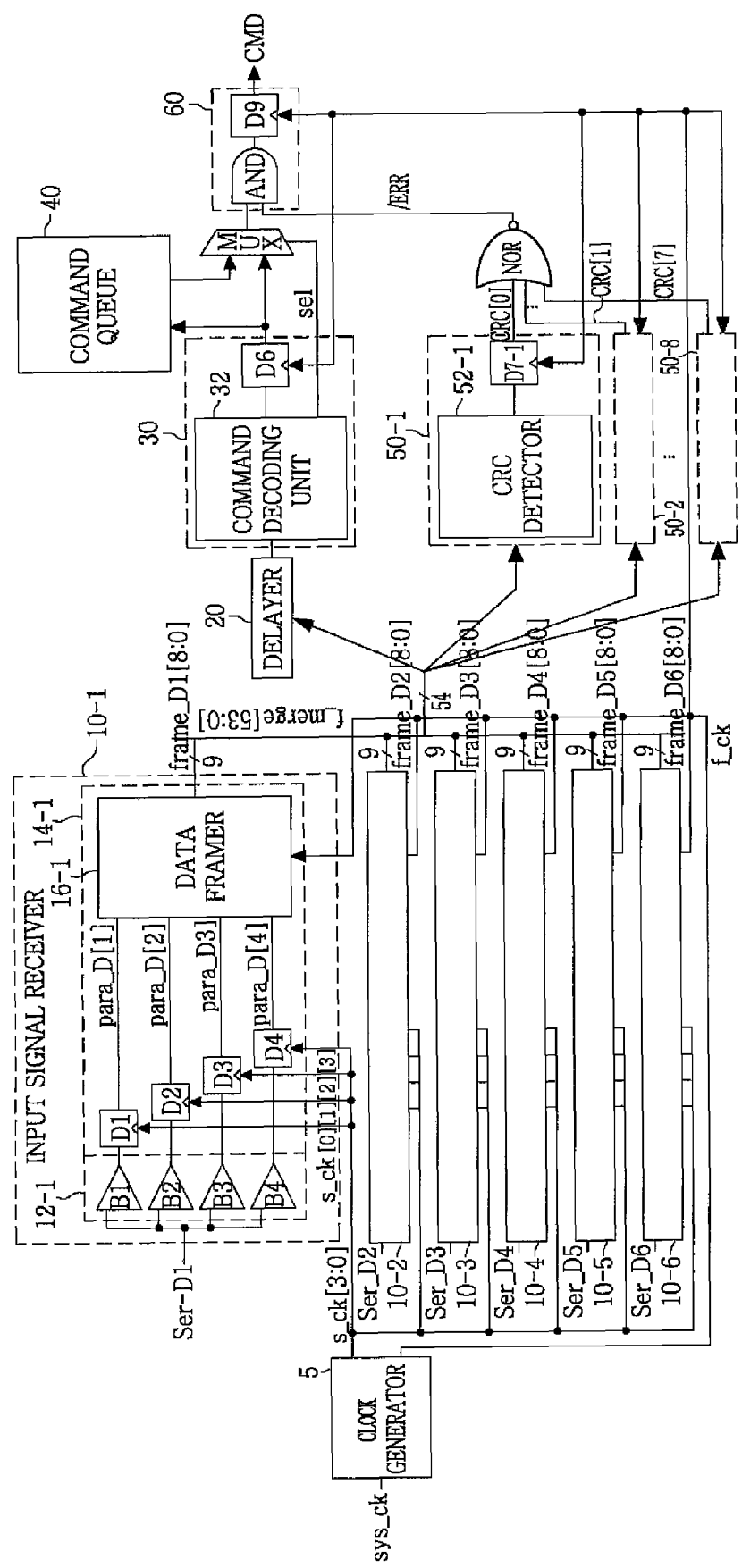
FIG. 1 is a circuit diagram of a conventional data parallelizing receiver.

A demultiplexer 12-1 and a plurality of flip-flops D1 to D4 of the input signal receiver 100-1 and the error command selector 600 have the same configurations as in the conventional data parallelizing receiver shown in FIG. 1. However, the data parallelizing receiver according to the present invention differs from the data parallelizing receiver shown in FIG. 1 in that the command decoder 300 further includes a fourth flip-flop D5, the first CRC partial calculator 500-1 includes a first CRC detector 520-1 having a number M of XOR gates that receive as an input signal a previously input first bitstream of parallel receiving data signals para_D[4:1], the second CRC partial calculator 600-1 includes a second CRC detector 600-1 having a number N of XOR gates, and the CRC partial calculation merger 700-1 includes a single XOR gate XOR and a fifth flip-flop D8.

Also, the data parallelizing receiver according to the present invention differs from the conventional data parallelizing receiver shown in FIG. 1 in that the fourth flip-flop D5 is used instead of a delayer and a second framing clock signal f_ck[1] of which a phase leading that of the conventional framing clock signal f_ck by half a cycle is generated and used along with a second framing clock signal f_ck[2] of which a phase is equal to that of the conventional framing clock signal f_ck.

Functions of the respective blocks of the data parallelizing receiver will now be described with reference to FIG. 4.

The functions of the demultiplexer 12-1 and the flip-flops D1 to D4 of the input signal receiver 100-1, a command queue 40, and a multiplexer MUX are the same as in the conventional data parallelizing receiver shown in FIG. 1 and thus, a description thereof will be omitted.

The clock generator 110 receives a system clock sys_ck, which is toggled at periods of a unit interval (UI) to control the operation of the entire data parallelizing receiver, and generates a plurality of sampling clock signals s_ck[3:0], a first framing clock signal f_ck[1], and a second framing clock signal f_ck[2]. The sampling clock signals s_ck[3:0] are quartered, delayed by a UI, and synchronized at periods of 4 UIs in order to sample a plurality of serial data a0~a8 to e0~e8. The first framing clock signal f_ck[1] is divided into ninths and synchronized at periods of 9 UIs in order to frame a plurality of sampled parallel data. Also, the second framing clock signal f_ck[2] has the same period as the first framing clock signal f_ck[1] and is synchronized by leaving a phase of the second framing clock signal f_ck[2] behind that of the first framing clock signal f_ck[2] by a predetermined period.

In a data parallelizer 140-1 of the input signal receiver 100-1, the flip-flops D1 to D4 sample and output the parallel receiving data signals para_D[4:1]. A data framer 160-1 receives the parallel receiving data signals para_D[4:1], separates a previously input first bitstream from a subsequently input second bitstream, aligns sampled data bits in synchronization with the first framing clock signal f_ck[1] or the second framing clock signal f_ck[2], and outputs first and second framing data signals f1_D1[4:0] and f2_D1[8:5].

In the command decoder 300, the fourth flip-flop D5 receives a first bitstream f_merge1[29:0] of a frame merge signal obtained by merging first bitstreams f1_D1[4:0] of frame data signals that are previously output from each of the input signal receivers 100-1 to 100-6 and outputs a third bitstream f_merge3[29:0] of the frame merge signal in synchronization with the second framing clock signal f_ck[2]. The command decoding unit 320 receives the third bitstream f_merge3[29:0] of the framing merge signal and a second bitstream f_merge2[53:30] of the framing merge signal obtained by merging subsequently input second bitstreams f2_D1[8:5] of the framing data signals from the fourth flip-flop D5, merges the received signals, and decodes input commands to detect the kinds of the input commands. Thereafter, the first flip-flop D6 outputs decoded commands in synchronization with the second framing clock signal f_ck[2].

In the first CRC partial calculator 500-1, the first CRC detector 520-1 receives the first bitstream f_merge1[29:0] of the framing merge signal, adds a redundancy bit to received data through a data transmitting terminal to generate a system code, transmits the system code, divides the system code through a data receiving terminal, and detects whether the transmitting data has an error depending on the presence or absence of the remainder so as to inspect the validity of an input command. Thereafter, the second flip-flops D7-1 to D7-8 output 1-bit first CRC partial calculation data signals CRC_p1[0] in synchronization with the second framing clock signal f_ck[2].

In the second CRC partial calculator 600-1, the second CRC detector 600-1 receives the second bitstream f_merge2 [53:30] of the framing merge signal obtained by merging the second bitstreams f2_D1[8:5] of the framing data signals and detects whether the received data has an error so as to inspect the validity of an input command as in the first CRC partial calculator 500-1. Thereafter, the second CRC detector 600-1 outputs a 1-bit second CRC partial calculation data signal CRC_p2[0].

In the CRC partial calculation merger 700-1, the XOR gate XOR receives the first and second CRC partial calculation data signals CRC_p1[0] and CRC_p2[0] and finally performs a logic XOR on the received signals. Thus, the fifth flip-flop D8 outputs an XOR result in synchronization with the second framing clock signal f_ck[2].

The data error determiner NOR receives plural-bit CRC mergence calculation data signals CRC_m[7:0] from the CRC partial calculation mergers 700-1 to 700-8 and performs a logic NOR on the received signals. Thus, when received data has an error and even a single-bit of the received data is applied at a high level, the data error determiner NOR outputs an error determination signal /ERR at a low level.

In the error command selector 600, the AND gate AND receives commands, which are directly output from the command decoding unit 320 through the multiplexer MUX or put on standby for a predetermined time in the command queue 40, and the error determination signal /ERR output from the data error determiner NOR, and performs a logic AND on the commands and the error determination signal /ERR, and the third flip-flop D9 outputs an AND result in synchronization with the second framing clock signal f_ck[2]. Thus, only when the CRC partial calculation merger 700-1 inputs a valid command packet without a data error, does the error command selector 600 selectively output the AND result to a core logic circuit.

Figure 5:
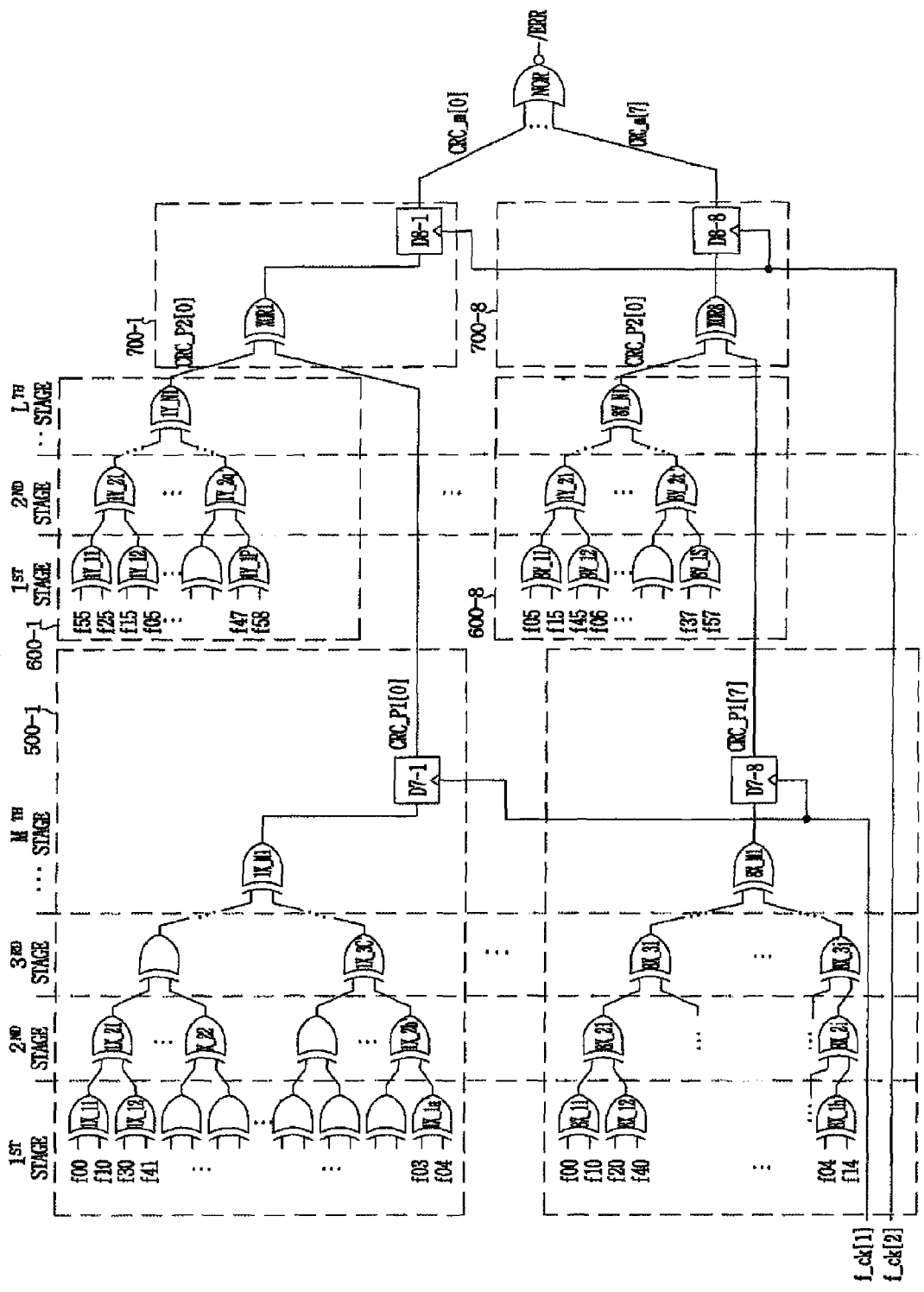
FIG. 5 is a circuit diagram of a plurality of CRC calculators and a data error determiner included in the data parallelizing receiver shown in FIG. 4.

FIG. 5 is a circuit diagram of the CRC calculators 500-1 to 500-8 and the data error determiner NOR included in the data parallelizing receiver shown in FIG. 4.

Referring to FIG. 5, the first CRC partial calculators 500-1 to 500-8 include multi-stage XOR gates 1X_1 to 8X_L1 and a plurality of flip-flops D7-1 to D7-8. The second CRC partial calculators 600-1 to 600-8 include multi-stage XOR gates 1Y_11 to 8Y_N1.

Also, the CRC partial calculation mergers 700-1 to 700-8 include a plurality of XOR gates XOR1 to XOR8 and a plurality of flip-flops D8-1 to D8-8, and the data error determiner NOR includes the NOR gate NOR.

Similarly, an input signal "fxy" applied to input terminals of the first and second XOR gates 1X_11 to 1X_1a and 1Y_11 to 1Y_1p' of a first stage denotes a y-th-bit data signal of the 5-bit first framing data signal f1_D1[4:0] and the 4-bit second framing data signal f2_D1[8:5] output through an x-th lane of the six lanes.

The first-stage first XOR gates 1X_11 to 1X_1a' of the multi-stage XOR gates 1X_11 to 8X_L1 of the first CRC partial calculator 500-1 receive combinations f00 to f04 of input signals obtained by a CRC calculation algorithm out of 30-bit framing merge signals f_merge[29:0]) of the 5 respective packets that are subsequently output through the 6 lanes, perform a logic XOR on the combinations f00 to f04, and output XOR results. Second-stage first XOR gates 1X_21 to 1X_2b' receive the output signals of the first-stage first XOR gates 1X_11 to 1X_1a' and perform a logic XOR on the received signals again. In this process, an M-stage XOR gate 1X_M1 finally outputs a 1-bit first CRC calculation data signal CRC_P1[0].

In the above-described process, the multi-stage first XOR gates 2X_11 to 8X_L1 of the first CRC partial calculators 500-2 to 500-8 receive output signals from front-stage first XOR gates, perform a logic XOR on the received signals, and output 2-bit to 8-bit first CRC partial calculation data signals CRC_P1[7:1].

The flip-flops D7-1 to D7-8 receive respective bits of the first CRC partial calculation data signals CRC_p1[7:0] from the M-stage first XOR gates 1X_M1 to 8X_M1 and previously output first CRC partial calculation data signals CRC_P1[7:0] in synchronization with the first framing clock signal f_ck[1].

Meanwhile, first-stage second XOR gates 1Y_11 to 1Y_1p' of the multi-stage second XOR gates 1Y_11 to 8Y_N1 of the second CRC partial calculator 600-1 receive combinations f55 to f58 of input signals obtained by the CRC calculation algorithm out of 24-bit framing merge signals f_merge2[53:30]) of the 5 respective packets that are subsequently output through the 6 lanes, perform a logic XOR on the combinations f55 to f58, and output XOR results. Second-stage second XOR gates 1Y_21 to 1Y_2q' receive the output signals of the first-stage second XOR gates 1Y_11 to 1Y_1p' and perform a logic XOR on the received signals again. In this process, an N-stage XOR gate 1X_N1 finally outputs a 1-bit second CRC calculation data signal CRC_P2[0].

In the above-described process, the multi-stage second XOR gates 2Y_11 to 8Y_N1 of the second CRC partial calculators 600-2 to 600-8 receive output signals from front-stage second XOR gates, perform a logic XOR on the received signals, and output 2-bit to 8-bit second CRC partial calculation data signals CRC_P2[7:1].

Thereafter, the XOR gates XOR1 to XOR8 of the CRC partial calculation mergers 700-1 to 700-8 receive signals obtained by merging the respective bits of the first CRC partial calculation data signal CRC_P1[7:0] with the respective bits of the second CRC partial calculation data signal CRC_P2[7:0], perform a logic XOR on the received signals, and output XOR results. The flip-flops D8-1 to D8-8 receive the XOR results from the XOR gates XOR1 to XOR8 and output CRC mergence calculation data signals CRC_m[7:0] in synchronization with the second framing clock signal f_ck[2].

The data error determiner NOR receives the CRC calculation data signals CRC_m[7:0], which are synchronized with the second framing clock f_ck[2], from the flip-flops D8-1 to D8-8, performs a logic XOR on the received signals, and finally outputs an error determination signal /ERR.

Operation of the CRC calculators 500-1 to 500-8 and the data error determiner NOR of the data parallelizing receiver according to the embodiment of the present invention will now be described with reference to FIG. 5.

Referring to FIG. 5, in a parallel CRC software algorithm, according to a generator polynomial ($X^8+X^5+X^3+X^2+X+1$), a previously input 1-bit first CRC calculation data signal CRC_P1[0] is f00 ^ f10 ^ f30 ^ f41 . . . f03 ^ f04, and a previously input 8-bit first CRC calculation data signal CRC_P1[7] is f00 ^ f10 ^ f20 ^ f40 . . . f04 ^ f14. Here, a symbol ^ denotes an XOR operator.

Meanwhile, according to the parallel CRC software algorithm, a subsequently input 1-bit second CRC partial calculation data signal CRC_P2[0] is f55 ^ f25 ^ f15 ^ f05 . . . f47 ^ f48, and a subsequently input 8-bit second CRC partial calculation data signal CRC_P2[7] is f05 ^ f15 ^ f45 ^ f06 . . . f37 ^ f57. Similarly, a symbol ^ denotes an XOR operator.

Since a process of obtaining the CRC partial calculation data signals CRC_P1[0], CRC_P1[7], CRC_P2[0], CRC_P2[7] using the CRC software algorithm and calculation values of the remaining CRC partial calculation data signals CRC_P1[6:2] and CRC_P2[6:2] are known to one of ordinary skill, a further detailed description thereof will be omitted here.

The XOR gates XOR1 to XOR8 of the CRC partial calculation mergers 700-1 to 700-8 receive the respective bits of the first CRC partial calculation data signal CRC_P1[7:0] and the respective bits of the second partial calculation data signal CRC_P2[7:0], perform a logic XOR on the received bits, and output CRC mergence calculation data signals CRC_m[7:0].

The NOR gate NOR of the data error determiner NOR receives the CRC mergence calculation data signals CRC_m [7:0] from the CRC partial calculation mergers 700-1 to 700-8, performs a logic NOR on the received signals, and finally outputs the error determination signal /ERR that is CRC_m

[0] # CRC_m[1] # CRC_m[2] ... # CRC_m[7]. Here, a symbol # denotes a NOR operator.

Accordingly, unlike in a conventional data parallelizing receiver that receives combinations of input signals, which are obtained by a CRC calculation algorithm out of 54-bit framing merge signals of 5 respective packets output through 6 lanes, in parallel at one time, the CRC calculators 500-1 to 500-8 and the data error determiner NOR of the data parallelizing receiver according to the present invention separate a previously input 30-bit framing merge signal f_merge1[29:0] from a subsequently input 24-bit framing merge signal f_merge1[53:30], partially perform CRC calculation, and merge partial calculation results. Thus, even if the bit numbers of the applied framing merge signals are increased, it is unnecessary to increase the number of XOR gates in proportion to the bit numbers. Thus, a time taken for CRC calculation can be greatly reduced.

Figure 6:
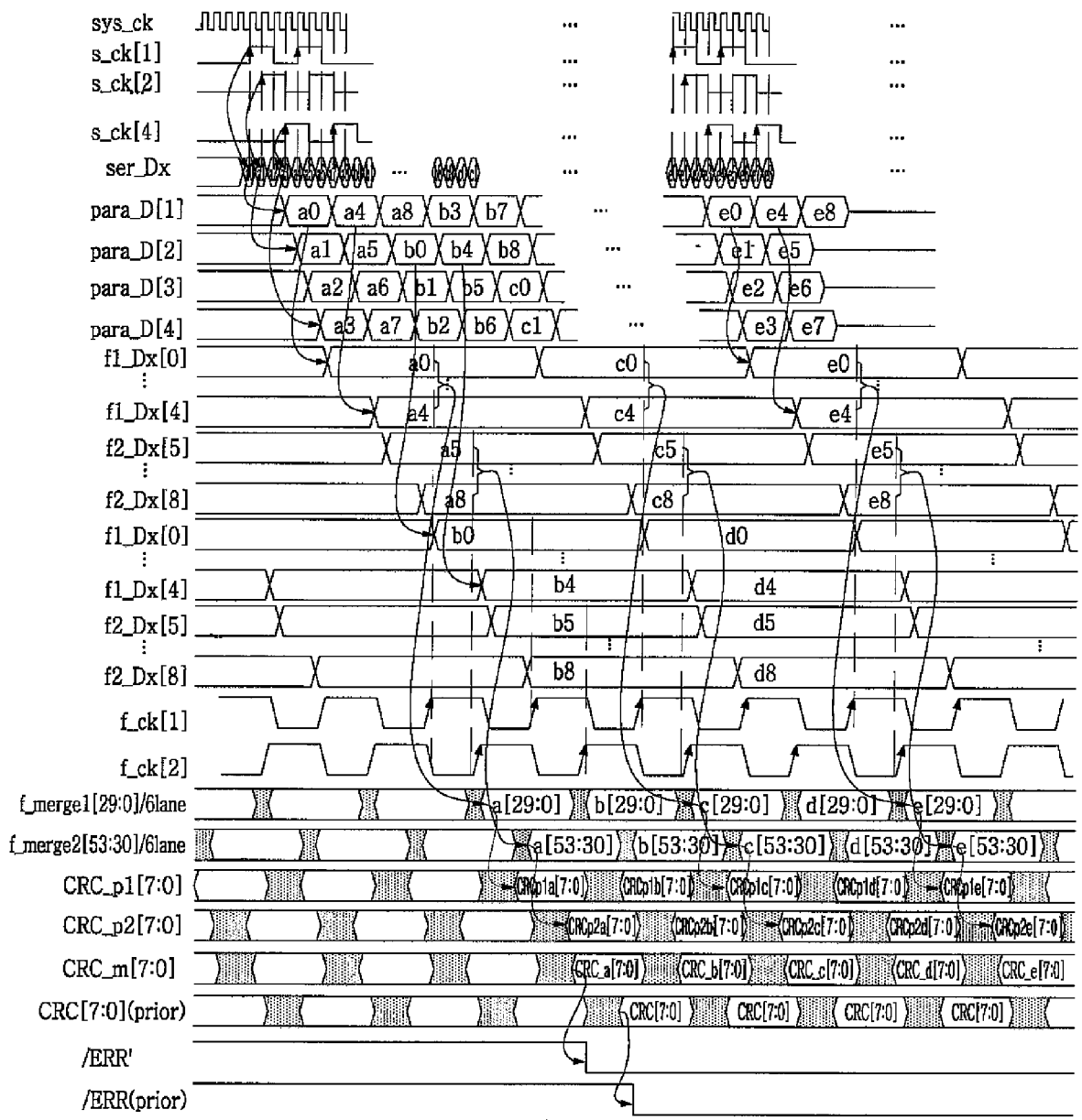
FIG. 6 is a timing diagram illustrating operation of the data parallelizing receiver shown in FIG. 4.

FIG. 6 is a timing diagram illustrating operation of the data parallelizing receiver shown in FIG. 4.

Referring to FIG. 6, the operation of the data parallelizing receiver is related to the input and output of a system clock signal sys_ck, a sampling clock signal s_ck[3:0], a serial input data signal ser_Dx (x is one of 1 to 6), a parallel receiving data signal para_D[4:1], first and second framing data signals f1_Dx[4:0] and f2_Dx[4:0] (x is one of 1 to 6), first and second framing clock signals f_ck[2:1], a first bitstream f_merge1[29:0] of a framing merge signal, a second bitstream f_merge2[53:30] of the framing merge signal, first and second CRC partial calculation data signals CRC_p1[7:0] and CRC_p2[7:0], a CRC mergence calculation data signal CRC_m[7:0], a conventional CRC calculation data signal CRC[7:0], an error determination signal /ERR', and a conventional error determination signal /ERR.

Figure 2:
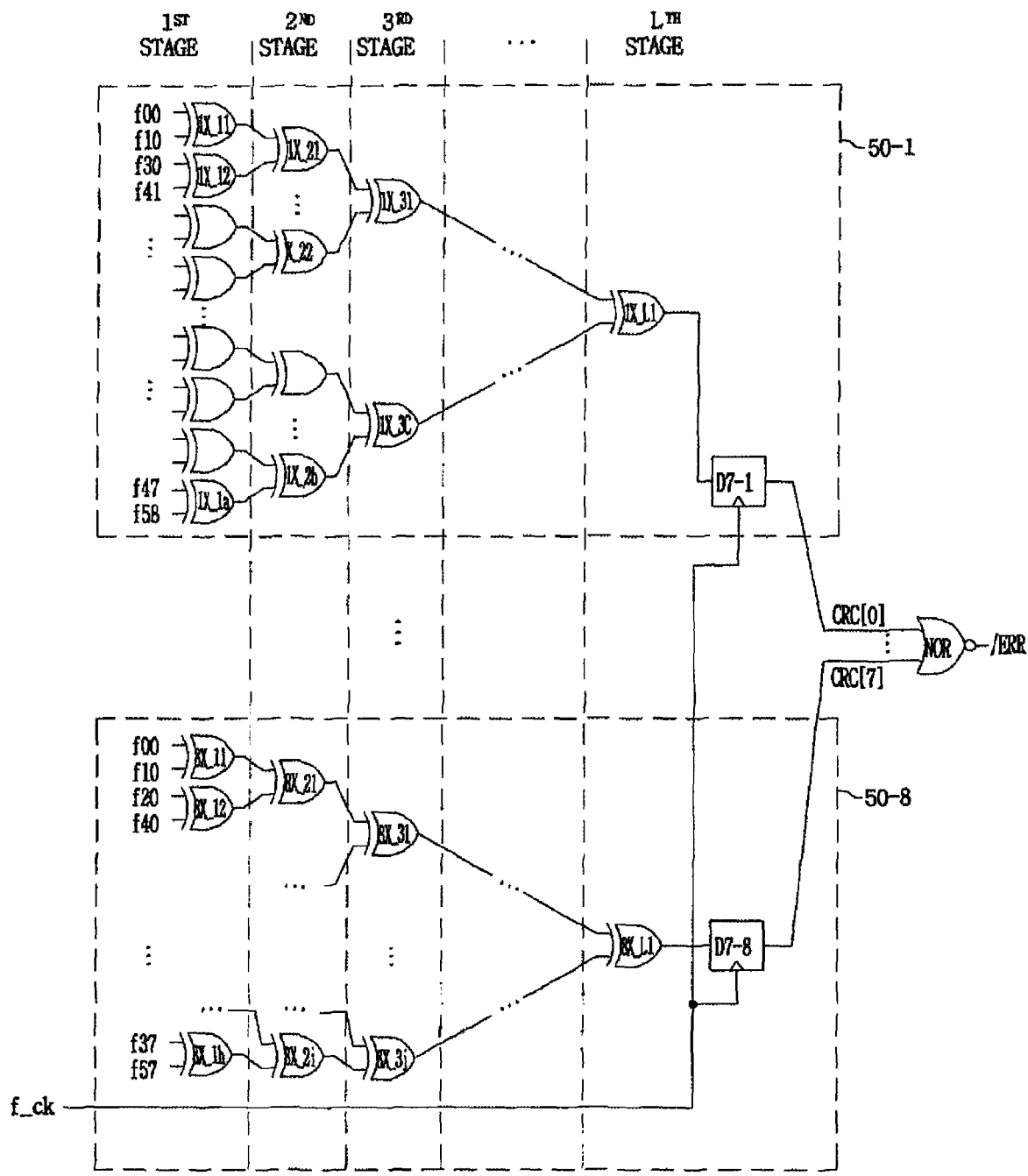
FIG. 2 is a circuit diagram of a plurality of cyclic redundancy check (CRC) calculators and a data error determiner included in the conventional data parallelizing receiver shown in FIG. 1.
Figure 3:
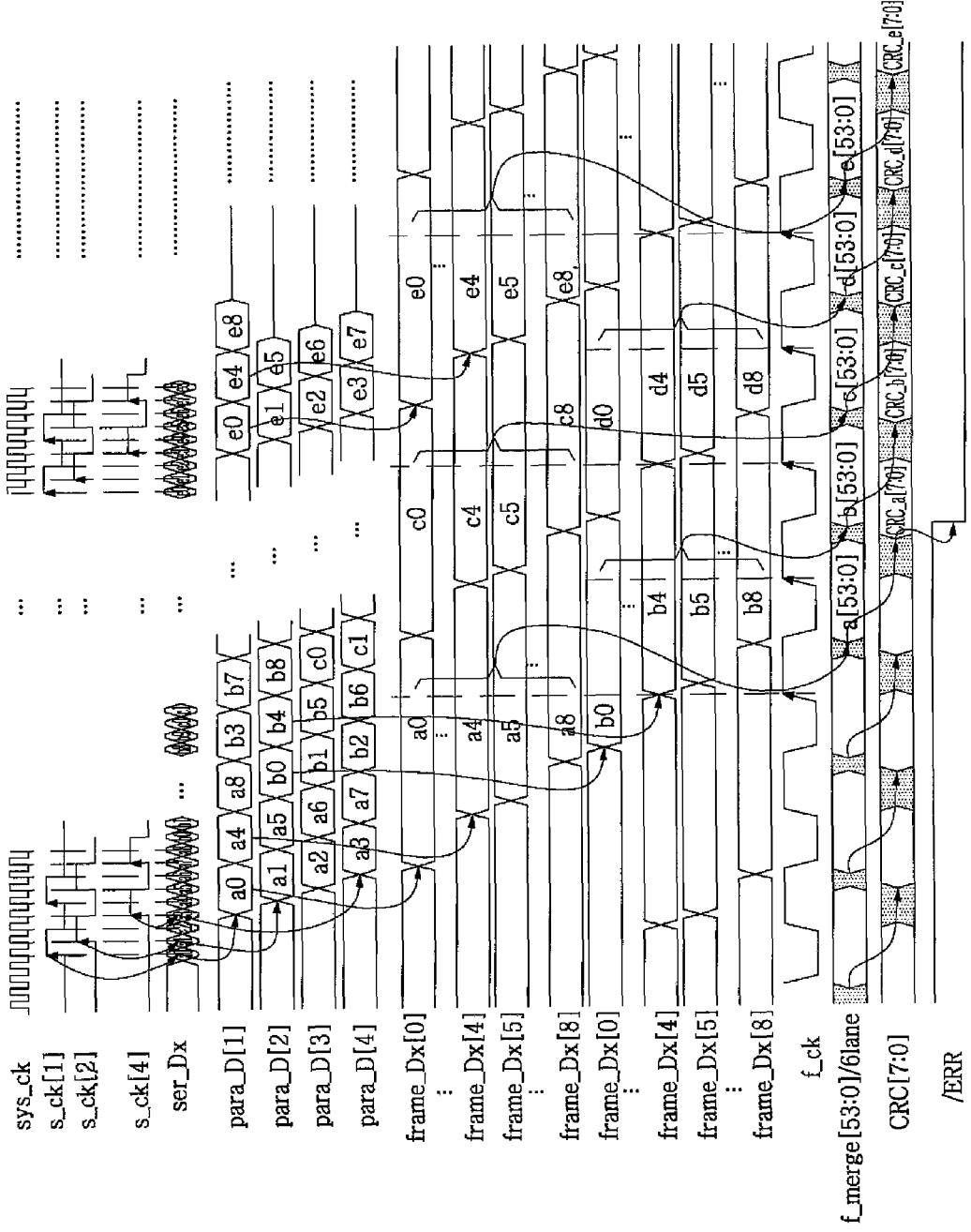
FIG. 3 is a timing diagram illustrating operation of the conventional data parallelizing receiver shown in FIG. 1.

The system clock signal sys_ck, the sampling clock signal s_ck[3:0], the serial input data signal ser_Dx, the parallel receiving data signal para_D[4:1], the first and second framing data signals f1_Dx[4:0] and f2_Dx[4:0], and the error determination signal /ERR' are the same as in the conventional data parallelizing receiver shown in FIG. 2 and thus, a further detailed description thereof will be omitted here.

The system clock signal sys_ck is received and divided into ninths to generate the first framing clock signal f_ck[1], which is toggled at periods of 9 UIs.

The second framing clock signal, of which a phase trails that of the first framing clock signal f_ck[1] by half a period, is toggled at the same period as the first framing clock signal f_ck[1].

5-bit first bitstreams f1_Dx[4:0] of framing data signals that are previously output in synchronization with the first framing clock signal f_ck[1] out of 9-bit framing data signals output from the input signal receivers 100-1 to 100-6 through the 6 lanes are merged to sequentially load first bitstreams f_merge1[29:0] of framing merge signals on a 30-bit data bus.

4-bit second bitstreams f2_D1[8:5] of the framing data signals that are subsequently output in synchronization with the second framing clock signal f_ck[2] out of the 9-bit framing data signals output from the input signal receivers 100-1 to 100-6 through the 6 lanes are merged to sequentially load second bitstreams f_merge2[53:30] of the framing merge signals on a 24-bit data bus.

The first CRC partial calculators 500-1 to 500-8 receive the first bitstreams f_merge1[29:0] of the framing merge signals and perform predetermined CRC calculations to detect whether data has an error. The second flip-flops D7-1 to D7-8 output the first CRC partial calculation data signals CRC_p1[7:0] in synchronization with the second framing clock signal f_ck[2].

The second CRC partial calculators 600-1 to 600-8 receive the second bitstreams f_merge2[53:30] of the framing merge signals, perform predetermined CRC calculations to detect whether data has an error, and output the second CRC partial calculation data signals CRC_p2[7:0].

In the CRC partial calculation mergers 700-1 to 700-8, the XOR gates XOR1 to XOR8 receive the first and second CRC partial calculation data signals CRC_p1[7:0] and CRC_p2[7:0] and finally perform a logic XOR on the received signals. Thereafter, the fifth flip-flop D8 outputs the CRC mergence calculation data signals CRC_m[7:0] in synchronization with the second framing clock signal f_ck[2].

The error determination signal /ERR is maintained at a high level until the data error determiner NOR receives the CRC mergence calculation data signals CRC_m[7:0] and performs a logic NOR on the CRC mergence calculation data signals CRC_m[7:0]. Thus, when a data error is detected and even a single bit of the 8-bit CRC mergence calculation data signal CRC_m[7:0] is applied at a high level, the error determination signal /ERR is disabled to a low level and maintained at the low level.

As described with reference to FIG. 6, in the data parallelizing receiver according to the present invention, a point in time where CRC calculation is finished, a data error is detected, and the error determination signal /ERR' is disabled to a low level is earlier than a point in time where an error determination signal /ERR is disabled to a low level in the conventional data parallelizing receiver, thereby shortening a time taken to detect data errors using CRC algorithms.

Operation of the data parallelizing receiver according to the exemplary embodiment of the present invention will now be described with reference to FIGS. 4 through 6.

Similarly, although the data parallelizing receiver is illustrated as including the plurality of input signal receivers 100-1 to 100-6 and the plurality of CRC calculators 800-1 to 800-8, the data parallelizing receiver may include a single input signal receiver and a single CRC calculator. Therefore, for brevity, only the first input signal receiver 100-1 and the first CRC calculator 800-1 will be chiefly described in detail.

When the data parallelizing receiver externally and sequentially receives 9 serial data a0~a8 to e0~e8 as 5 packets through 6 lanes, the demultiplexer 12-1 outputs 4 parallel data through each of the lanes, and the 4 flip-flops D1 to D4 of the data parallelizer 140-1 sequentially fetch sampled data of the parallel data through 4 data lines at periods of a UI and output pipeline-type parallel receiving data signals para_D[4:1]. That is, operations of the demultiplexer 12-1 and the flip-flops D1 to D4 are the same as in the conventional data parallelizing receiver described with reference to FIGS. 1 and 2 and thus, a detailed description thereof will be omitted here.

The clock generator 110 receives the system clock signal sys_ck for controlling the operation of the data parallelizing receiver and generates a plurality of sampling clock signals s_ck03:0], a first framing clock signal f_ck[1], and a second framing clock signal f_ck[2]. The sampling clock signals s_ck[3:0] are quartered, delayed by a UI, and synchronized at periods of 4 UIs in order to sample a plurality of serial data a0~a8 to e0~e8. The first framing clock signal f_ck[1] is divided into ninths and synchronized at periods of 9 UIs in order to frame a plurality of sampled parallel data. Also, the second framing clock signal f_ck[2] has the same period as the first framing clock signal f_ck[1] and is synchronized by leaving a phase of the second framing clock signal f_ck[2] behind that of the first framing clock signal f_ck[2] by half a period.

In the data parallelizer 140-1 of the input signal receiver 100-1, the flip-flops D1 to D4 sample and output the parallel receiving data signals para_D[4:1]. The data framer 160-1 receives the parallel receiving data signals para_D[4:1] and separates a previously input first bitstream f1_D1[4:0] from a subsequently input second bitstream f2_D1[8:5] instead of aligning the parallel receiving data signals para_D[4:1] at one time as in the conventional data parallelizing receiver.

Thereafter, the data framer 160-1 aligns sampled data bits of the first bitstream of the parallel receiving data signal para_D[4:1] in synchronization with the first framing clock signal f_ck[1] and outputs the first framing data signal f1_D1[4:0]. Also, the data framer 160-1 aligns sampled data bits of the second bitstream of the parallel receiving data signal para_D[4:1] in synchronization with the second framing clock signal f_ck[2] and outputs the second framing data signal f2_D1[8:5].

The 5-bit first bitstreams f1_Dx[4:0] of the framing data signals that are previously output in synchronization with the first framing clock signal f_ck[1] out of the 9-bit framing data signals output from the input signal receivers 100-1 to 100-6 through the 6 lanes are merged to sequentially load the first bitstreams f_merge1[29:0] of the framing merge signals on the 30-bit data bus.

The command decoder 300 must synchronize the 30-bit data f_merge1[29:0] obtained by merging the previously input first bitstreams f1_Dx[4:0] of the framing data signals with the 24-bit data f_merge2[53:30] obtained by merging the subsequently input second bitstreams f2_Dx[8:5] of the framing data signals in order to merge the 30-bit data f_merge1[29:0] with the 24-bit data f_merge2[53:30]. Accordingly, the fourth flip-flop D5 receives first bitstreams f_merge1[29:0] of framing merge signals from the input signal receivers 100-1 to 100-6 and outputs the 30-bit third bitstreams f_merge1[29:0] of the framing merge signals in synchronization with the second framing clock signal f_ck[2].

Thereafter, the command decoding unit 320 receives the 30-bit third bitstreams f_merge1[29:0] of the framing merge signals from the fourth flip-flop D5, receives the 24-bit framing merge signal f_merge2[53:30] obtained by merging the subsequently input second bitstreams f2_Dx[8:5] of the framing data signals, merges the 30-bit third bitstreams f_merge1[29:0] of the framing merge signals and the 24-bit framing merge signal f_merge2[53:30] into 54-bit data signals, decodes input commands to detect the kinds of the input commands, and outputs decoded commands in synchronization with the second framing clock signal f_ck[2].

The command queue 40 receives the decoded commands, temporarily stores the decoded commands according to functions of execution commands, puts the commands on standby for a predetermined time according to a data transmission protocol, and outputs the commands. Also, the multiplexer MUX receives the decoded commands from the first flip-flop D6 and the command queue 40 and selectively outputs the commands in response to a selection signal "sel". Since the operations of the command queue 40 and the multiplexer MUX are the same as in the conventional data parallelizing receiver described with reference to FIGS. 1 and 2, a further detailed description thereof will be omitted here.

Meanwhile, in the first CRC partial calculator 500-1, the first CRC detector 520-1 receives the previously input and aligned 30-bit first bitstreams f_merge1[29:0] of the framing merge signals, performs a partial CRC calculation, and previously obtains a partial calculation result. In this case, as in the conventional data parallelizing receiver, during the partial CRC calculation, the first CRC detector 520-1 adds a redundancy bit to received data through a data transmitting terminal to generate a system code, transmits the system code, divides the system code through a data receiving terminal, and detects whether the transmitting data has an error depending on the presence or absence of the remainder so as to inspect the validity of a previously input command.

Thereafter, the second flip-flop D7-1 of the first CRC partial calculator 500-1 receives the CRC partial calculation result on the 30-bit first bitstreams f_merge1[29:0] of the framing merge signals from the first CRC detector 520-1 and outputs the 1-bit first CRC partial calculation data signal CRC_p1[0] in synchronization with the second framing clock signal f_ck[2]. In this process, the first CRC partial calculators 500-2 to 500-8 output 2-bit to 8-bit first CRC partial calculation data signals CRC_P1[7:1].

Also, the second CRC detector 600-1 of the second CRC partial calculator 600-1 receives the subsequently input and aligned 24-bit second bitstreams f_merge2[53:30] of framing merge signals, performs a partial CRC calculation as in the first CRC partial calculator 500-1, detects whether the subsequently input data has an error, and outputs the 1-bit second CRC partial calculation data signal CRC_p2[0]. In this process, the second CRC partial calculators 600-2 to 600-8 output 2-bit to 8-bit second CRC partial calculation data signals CRC_P2[7:1].

In the CRC partial calculation mergers 700-1 to 700-8, the XOR gates XOR1 to XOR8 receive the 8-bit first CRC partial calculation data signals CRC_p1[7:0] from the first CRC partial calculators 500-1 to 500-8, receive the 8-bit second CRC partial calculation data signals CRC_p2[7:0] from the second CRC partial calculators 600-1 to 600-8, and perform a logic XOR on the received signals. Thereafter, the fifth flip-flops D8-1 to D8-8 output the CRC mergence calculation data signals CRC_m[7:0]) in synchronization with the second framing clock signal f_ck[2].

The data error determiner NOR receives the plural-bit CRC mergence calculation data signals CRC_m[7:0] from the CRC partial calculation mergers 700-1 to 700-8 and performs a logic NOR on the received signals. Thus, when a data error is detected and even a single bit of the received signals is applied at a high level, the data error determiner NOR outputs an error determination signal /ERR at a low level.

In the error command selector 600, the AND gate AND directly receives the commands from the command decoding unit 320 when the selection signal "sel" is applied at a low level from the multiplexer MUX to a first input terminal of the AND gate AND, and receives the commands, which are put on standby for the predetermined time in the command queue 40 according to the data transmission protocol, when the selection signal "sel" is applied at a high level to the first input terminal of the AND gate AND. Also, the error determination signal /ERR is applied from the data error determiner NOR to a second input terminal of the AND gate AND. Thus, the AND gate AND performs a logic AND on the received commands and the error determination signal /ERR and outputs an AND result to the third flip-flop D9.

Thereafter, the third flip-flop D9 outputs the AND result in synchronization with the second framing clock signal f_ck[2]. Thus, only when the data error determiner NOR detects no data error and outputs the error determination signal /ERR at a high level, does the third flip-flop D9 selectively output the decoded commands to the core logic circuit.

As described above, unlike a conventional data parallelizing receiver for parallelizing input commands in packet units at one time, the data parallelizing receiver according to the present invention separately aligns a single command packet in synchronization with clock signals with at least two different phases according to the input order of commands, performs CRC partial calculations, finally merges CRC partial calculation results, and time-adaptively generates CRC calculation result data. Therefore, a time taken to detect CRC data errors can be lessened.

A data parallelizing receiver according to the present invention time-adaptively generates CRC calculation data to a time in the input order of commands and shortens a time taken to detect data errors. Thus, the performance of the data parallelizing receiver requiring a high data rate can be improved. Also, even if the number of input bits to be parallelized is increased, it can be more efficient to design circuits.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A data parallelizing receiver comprising:
    an input signal receiver that receives packetized serial data, samples the serial data, aligns the sampled data in an input order, and converts the aligned data into parallel data to output the parallel data;
    a cyclic redundancy check (CRC) partial calculator that receives the parallel data, classifies the parallel data into groups according to the input order, and performs a partial CRC calculation on each of the groups to sequentially output a plurality of partial CRC calculation results;
    a CRC partial calculation merger that receives the plurality of partial CRC calculation results and merges the partial CRC calculation results to output CRC calculation data;
    a clock generator that receives a system clock signal, generates a first clock signal to synchronously sample the serial data, generates a second clock signal to frame the sampled data, and generates a third clock signal having a phase that lags a phase of the second clock signal;
    a command decoder that receives a first bitstream of a parallel data merge signal obtained by merging a previously input first bitstream for each of the groups to generate a third bitstream of the parallel data merge signal synchronously with the third clock signal, and receives a second bitstream of a parallel data merge signal obtained by merging a subsequently input second bitstream for each of the groups to generate a merged second bitstream, and decoding the merged second bitstream to output decoded commands;
    an output command selector that receives the decoded commands, temporarily stores the decoded commands, and holds the decoded commands in standby to selectively output the decoded commands in response to a selection signal received with the decoded commands, wherein the output command selector comprises:
        a command queue that receives the decoded commands, temporarily stores the decoded commands, and holds the decoded commands for a predetermined time according to a data transmission protocol to output the decoded commands; and
        a multiplexer that receives the decoded commands from the command decoder and the command queue to selectively output the commands in response to the selection signal;
    a data error determiner that receives the CRC calculation data, performs a logic NOR on the CRC calculation data, and determines whether there is a data error to output an error determination signal; and
    an error command selector that receives the decoded command and the error determination signal and performs a logic AND on the decoded command and the error determination signal to selectively output the decoded command only when the data error is not detected.

2. The data parallelizing receiver according to claim 1, wherein the input signal receiver comprises:
    a demultiplexer that receives the packetized serial data and demultiplexes the serial data to output the parallel data;
    a plurality of flip-flops that respectively receive the parallel data, sample bits of the parallel data synchronously with the first clock signal, and sequentially fetch the sampled data through a plurality of data lines at periods of a unit interval (UI) to output a pipeline-type parallel receiving data signal; and
    a data framer that receives the parallel receiving data signal, separate the previously input first bitstream from the subsequently input second bitstream, and aligns the sampled data bits synchronously with the second clock signal or the third clock signal to output first and second parallel data signals.

3. The data parallelizing receiver according to claim 2, wherein the input signal receiver merges the first parallel data signals, as respectively output through a plurality of lanes, to sequentially output the first bitstream of the parallel data merge signal and merges the second parallel data signals, as respectively output through the lanes, to sequentially output the second bitstream of the parallel data merge signal.

4. The data parallelizing receiver according to claim 1, wherein the command decoder comprises:
    a first flip-flop that receives the first bitstream of the parallel data merge signal to output the third bitstream of the parallel data merge signal synchronously with the third clock signal;
    a command decoding unit that receives and merges the third bitstream of the parallel data merge signal and the second bitstream of the parallel data merge signal and decodes the merged bitstream to output the decoded command; and
    a second flip-flop that receives the decoded command to output the decoded command synchronously with the third clock signal.

5. The data parallelizing receiver according to claim 1, wherein the multiplexer directly outputs the commands decoded by the command decoding unit when the selection signal is at a low level, and outputs the commands held in standby by the command queue for the predetermined time when the selection signal is at a high level.

6. The data parallelizing receiver according to claim 5, wherein the CRC partial calculator comprises:
    a first CRC partial calculator that receives the first bitstream of the parallel data merge signal and partially performs a CRC calculation to previously output a first partial CRC calculation result in synchronization with the third clock signal; and
    a second CRC partial calculator that receives the second bitstream of the parallel data merge signal and partially performs a CRC calculation to subsequently output a second partial CRC calculation result.

7. The data parallelizing receiver according to claim 6, wherein the first CRC partial calculator comprises:
    a first CRC detector that receives the first bitstream of the parallel data merge signal and partially performs a CRC calculation to output the first partial CRC calculation result; and a third flip-flop that receives the first partial CRC calculation result to output a first CRC partial calculation data signal in synchronization with the third clock signal.

8. The data parallelizing receiver according to claim 7, wherein the second CRC partial calculator includes a second CRC detector that receives the second bitstream of the parallel data merge signal and partially performs a CRC calculation to output the second CRC partial calculation data signal.

9. The data parallelizing receiver according to claim 8, wherein each of the first and second CRC detectors includes a plurality of XOR gates that respectively receive the parallel data merge signals and generate remainders obtained by dividing the parallel data merge signals by data corresponding to a generator polynomial as the plurality of CRC partial calculation data signals.

10. The data parallelizing receiver according to claim 8, wherein the CRC partial calculation merger comprises:
    an XOR gate that receives the first and second CRC partial calculation data signals to perform a logic XOR on the first and second CRC partial calculation data signals; and
    a fourth flip-flop that receives an XOR result to output the CRC calculation data in synchronization with the third clock signal.

11. The data parallelizing receiver according to claim 10, wherein the error command selector comprises:
    an AND gate that receives the decoded command or the command held in standby for the predetermined time via a first input terminal, receives the XOR result via a second input terminal, and performs a logic AND on the received command and the XOR result to output an AND result; and
    a fifth flip-flop that receives the AND result to output the decoded command or the command held in standby for the predetermined time in synchronization with the third clock signal.

12. The data parallelizing receiver according to claim 10, wherein the error command selector selectively outputs the decoded command or the command held in standby for the predetermined time only when no data error is detected by the data error determiner.

* * * * *